United States Patent
Shon et al.

(10) Patent No.: US 10,807,408 B2
(45) Date of Patent: *Oct. 20, 2020

(54) DECORATION MEMBER AND MANUFACTURING METHOD THEREFOR

(71) Applicant: LG CHEM, LTD., Seoul (KR)

(72) Inventors: Jeong Woo Shon, Daejeon (KR); Song Ho Jang, Daejeon (KR); Jin Suk Song, Daejeon (KR); Ji Young Hwang, Daejeon (KR); Ki Hwan Kim, Daejeon (KR); Yong Chan Kim, Daejeon (KR); Han Min Seo, Daejeon (KR); Pilsung Jo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/465,493

(22) PCT Filed: Mar. 6, 2018

(86) PCT No.: PCT/KR2018/002672
§ 371 (c)(1),
(2) Date: May 30, 2019

(87) PCT Pub. No.: WO2018/164464
PCT Pub. Date: Sep. 13, 2018

(65) Prior Publication Data
US 2020/0062027 A1   Feb. 27, 2020

(30) Foreign Application Priority Data

Mar. 6, 2017 (KR) .................. 10-2017-0028261
Oct. 20, 2017 (KR) .................. 10-2017-0136790

(51) Int. Cl.
*B32B 7/02* (2019.01)
*B44F 1/14* (2006.01)
(Continued)

(52) U.S. Cl.
CPC .............. *B44F 1/14* (2013.01); *B44F 1/10* (2013.01); *C23C 14/0036* (2013.01);
(Continued)

(58) Field of Classification Search
CPC ........... B32B 27/16; B32B 27/20; B32B 3/26; B32B 7/023; B44F 1/10; G02B 5/22
See application file for complete search history.

(56) References Cited

U.S. PATENT DOCUMENTS 5,637,273 A    6/1997  Goo
7,187,487 B2 * 3/2007  Przybyla .................. G02B 5/22
                                                                345/108
(Continued)

FOREIGN PATENT DOCUMENTS

JP    10-212597 A    8/1998
JP    2001-264525 A   9/2001
(Continued)

OTHER PUBLICATIONS

Wojciech Mokrzycki et al., "Color difference Delta E—A survey", Machine Graphics and Vision 20(4), Apr. 2011.

*Primary Examiner* — Lawrence D Ferguson
(74) *Attorney, Agent, or Firm* — Dentons US LLP

(57) ABSTRACT

The present disclosure relates to a decoration element comprising a light reflective layer; and a color developing layer comprising a light absorbing layer provided on the light reflective layer, wherein the light absorbing layer comprises two or more points with different thicknesses.

17 Claims, 13 Drawing Sheets

(51) Int. Cl.
  *B44F 1/10*   (2006.01)
  *C23C 14/00*  (2006.01)
  *C23C 14/06*  (2006.01)
  *C23C 14/20*  (2006.01)
  *C23C 14/34*  (2006.01)
  *G02B 5/00*   (2006.01)

(52) U.S. Cl.
  CPC ........ *C23C 14/0676* (2013.01); *C23C 14/205* (2013.01); *C23C 14/34* (2013.01); *G02B 5/003* (2013.01)

(56) References Cited

U.S. PATENT DOCUMENTS

| | | | |
|---|---|---|---|
| 7,923,122 | B2 | 4/2011 | Korechika et al. |
| 8,507,073 | B2 | 8/2013 | Nishikawa et al. |
| 9,903,989 | B2 | 2/2018 | Kim et al. |
| 2003/0184866 | A1 | 10/2003 | Mimura et al. |
| 2005/0024754 | A1 | 2/2005 | Epstein et al. |
| 2008/0003416 | A1 | 1/2008 | Watson et al. |
| 2011/0262713 | A1 | 10/2011 | Nakao et al. |
| 2012/0068450 | A1 | 3/2012 | Macpherson et al. |
| 2014/0104690 | A1 | 4/2014 | Sandre-Chardonnal |
| 2016/0089849 | A1 | 3/2016 | Kayanoki et al. |

FOREIGN PATENT DOCUMENTS

| | | | |
|---|---|---|---|
| JP | 2002-108221 | A | 4/2002 |
| JP | 2003-053908 | A | 2/2003 |
| JP | 2008-013833 | A | 1/2008 |
| JP | 2008-083599 | A | 4/2008 |
| JP | 2008-201104 | A | 9/2008 |
| JP | 2009-080205 | A | 4/2009 |
| JP | 2009-168928 | A | 7/2009 |
| JP | 2009-291966 | A | 12/2009 |
| JP | 2010-197798 | A | 9/2010 |
| JP | 2011-140136 | A | 7/2011 |
| JP | 2011-170295 | A | 9/2011 |
| JP | 2011-173379 | A | 9/2011 |
| JP | 2011-191338 | A | 9/2011 |
| JP | 5016722 | B2 | 9/2012 |
| JP | 2013-193268 | A | 9/2013 |
| JP | 2016-068557 | A | 5/2016 |
| KR | 10-0162887 | B1 | 2/1999 |
| KR | 10-2008-0078523 | A | 8/2008 |
| KR | 10-2010-0108572 | A | 10/2010 |
| KR | 10-2013-0012783 | A | 2/2013 |
| KR | 10-2014-0029333 | A | 3/2014 |

* cited by examiner

[FIG. 1]
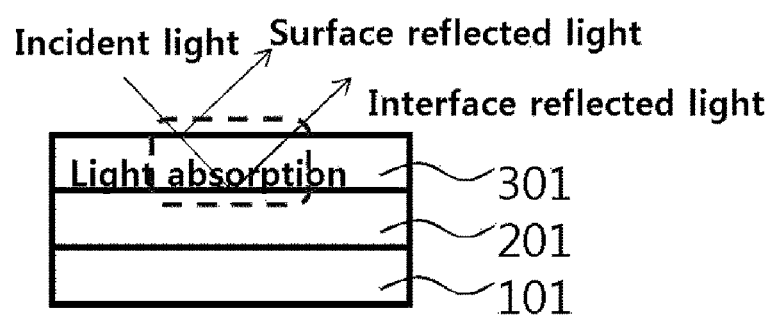
[FIG. 2]
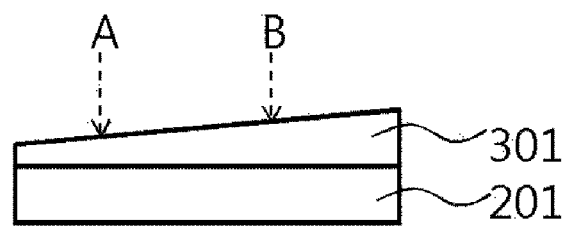
[FIG. 3]
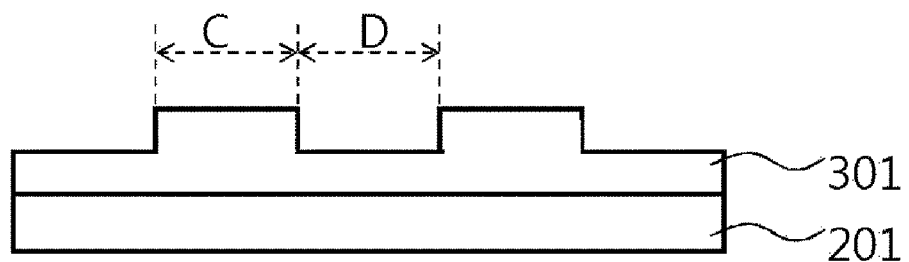

[FIG. 4]
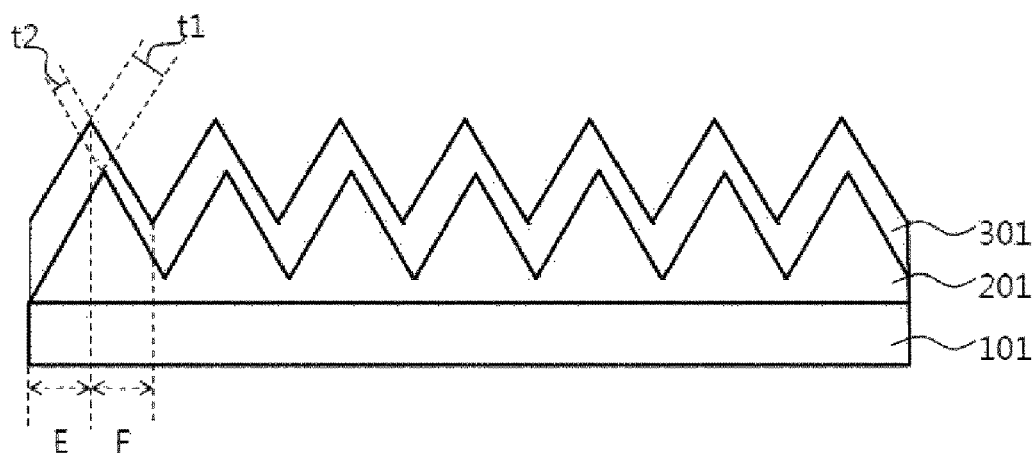
[FIG. 5]
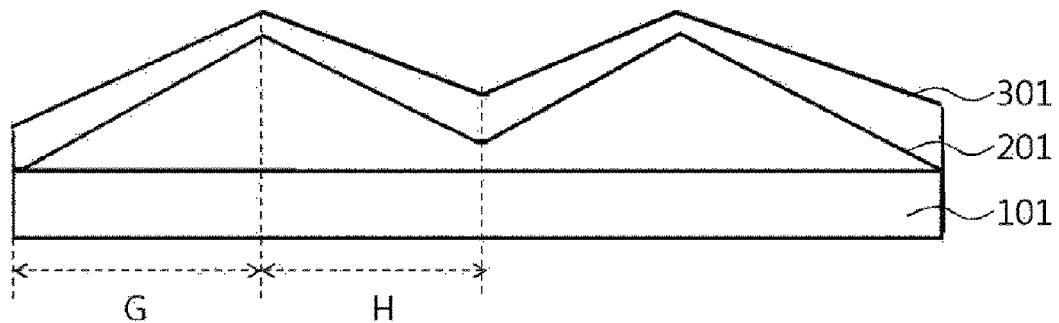

[FIG. 6]
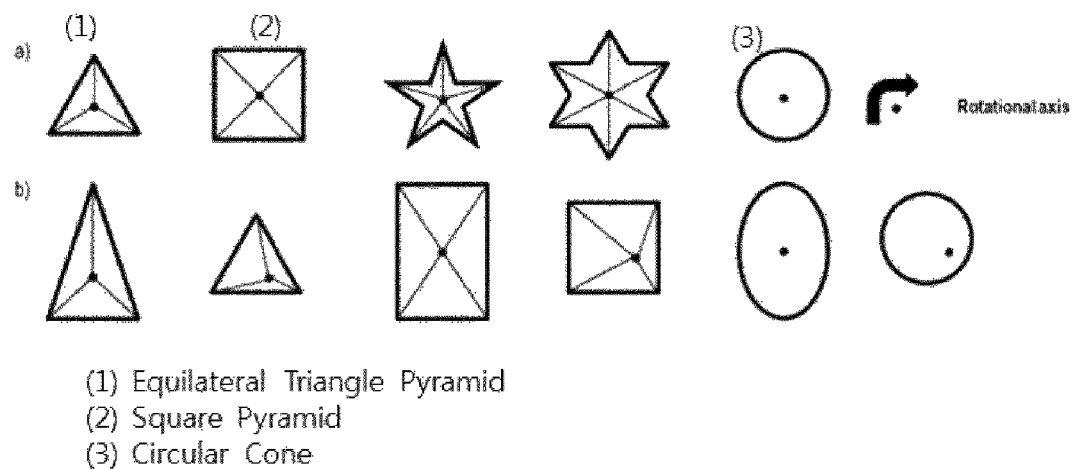
(1) Equilateral Triangle Pyramid
(2) Square Pyramid
(3) Circular Cone
[FIG. 7]
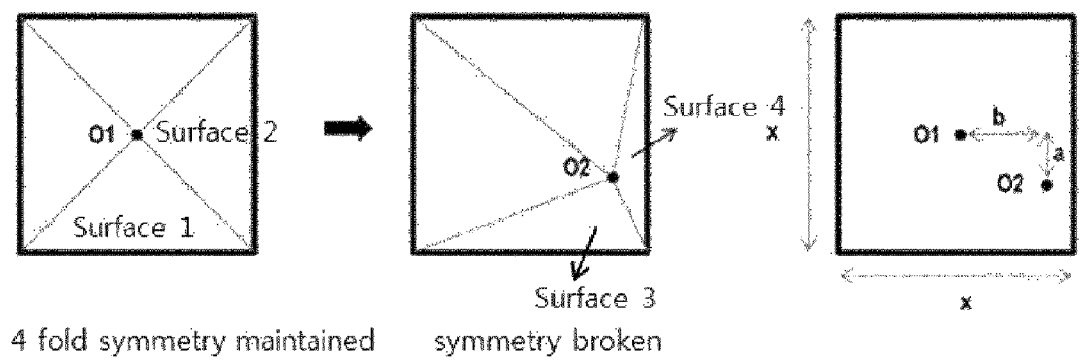
4 fold symmetry maintained    symmetry broken

[FIG. 8]
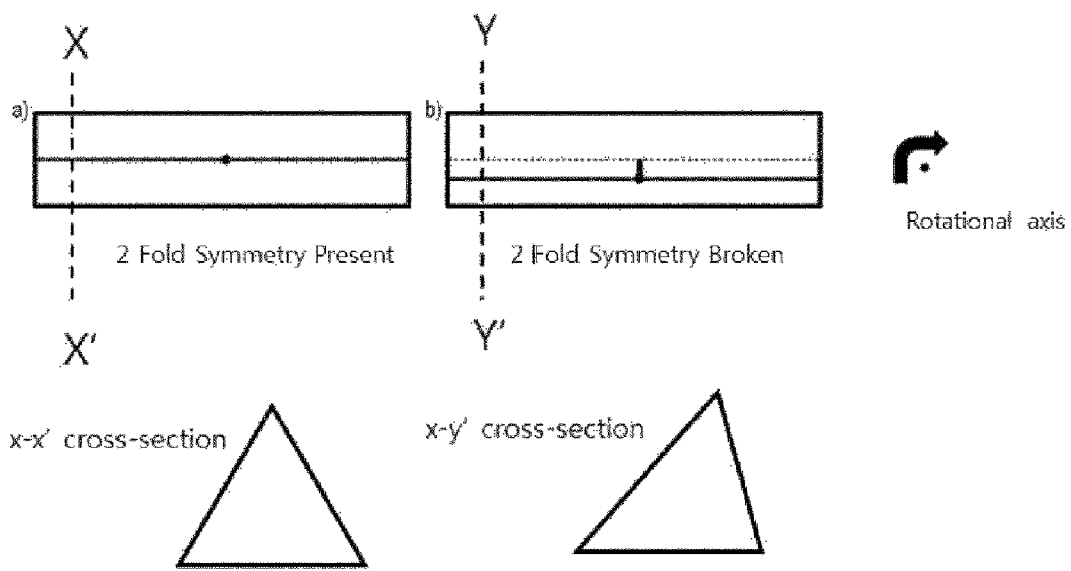
[FIG. 9]
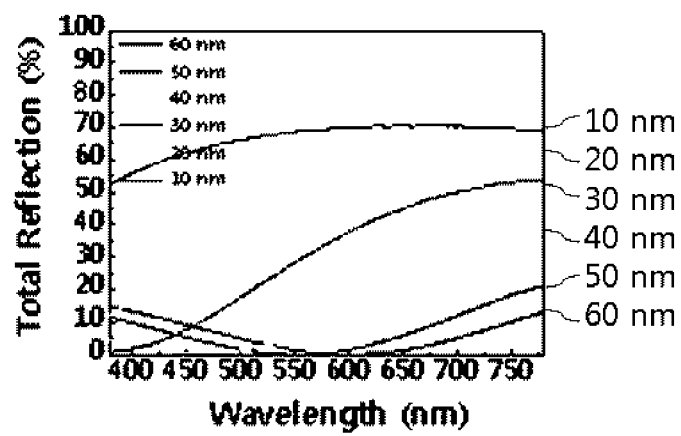

[FIG. 10]
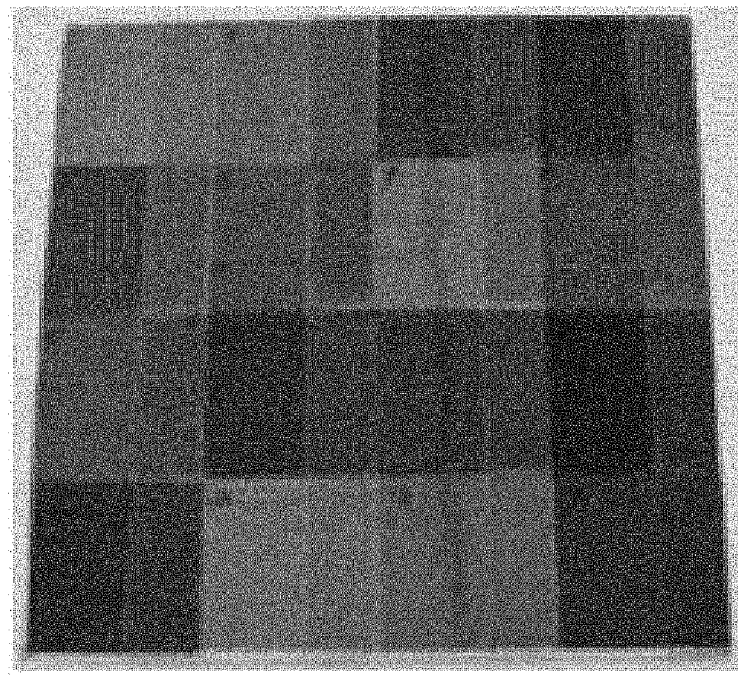

[FIG. 11]
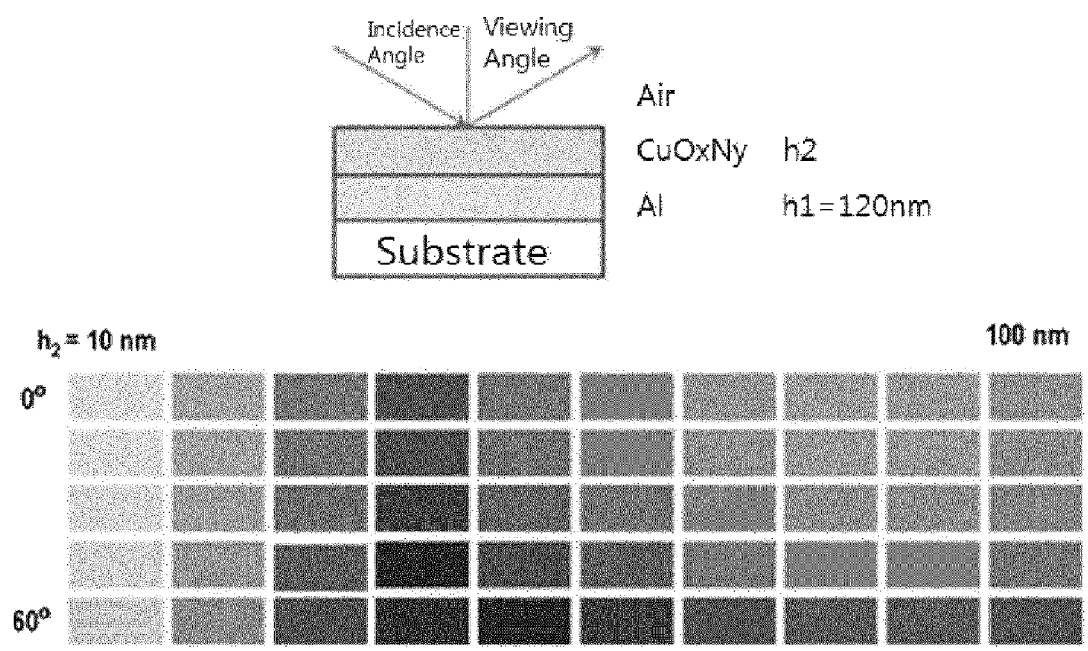

[FIG. 12]
(a) Example 1
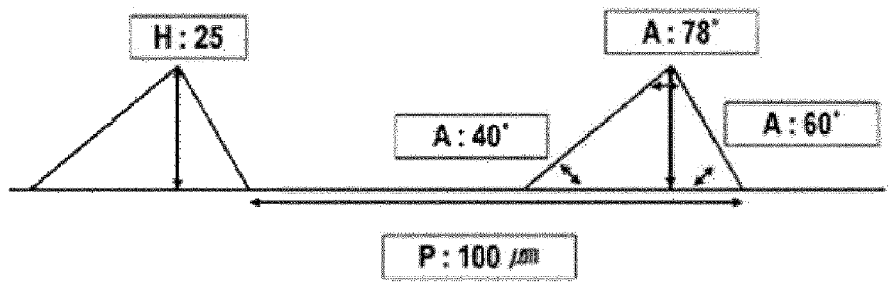
(b) Example 1
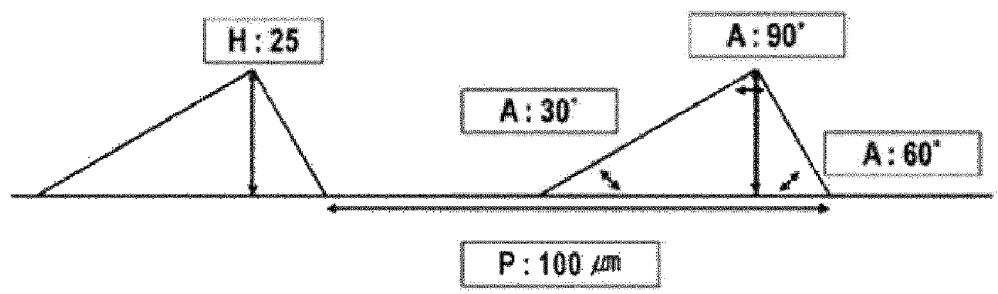
(c) Example 3
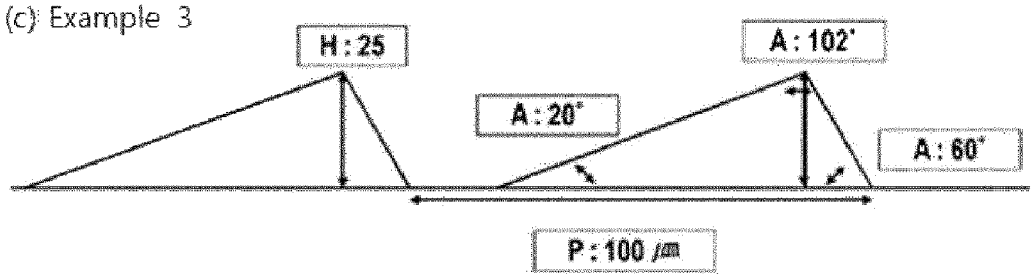
(d) Comparative Example 1
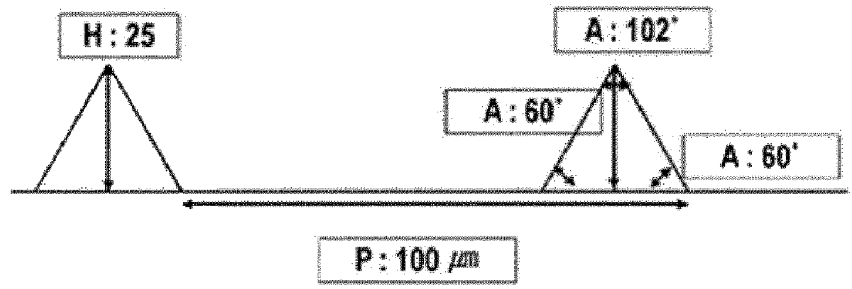

[FIG 13]
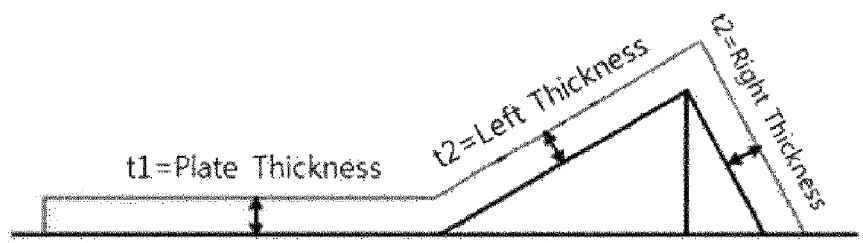
| | Left | | | Right | | |
|---|---|---|---|---|---|---|
| | Angle (°) | Thickness (nm) | Color (CIE L*ab) | Angle(°) | Thickness (nm) | Color (CIE L*ab) |
| Example 1 | 40 | 50 | 22,4,4 | 60 | 35 | 48,13,23 |
| Example 2 | 30 | 60 | 36,2,7 | 60 | 35 | 48,13,23 |
| Example 3 | 20 | 66 | 28,1,-11 | 60 | 35 | 48,13,23 |
| Comparative Example 1 | 60 | 35 | 48,13,23 | 60 | 35 | 48,13,23 |
[FIG 14]
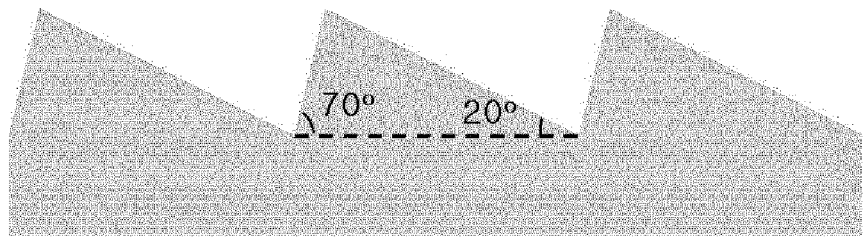

[FIG. 15]
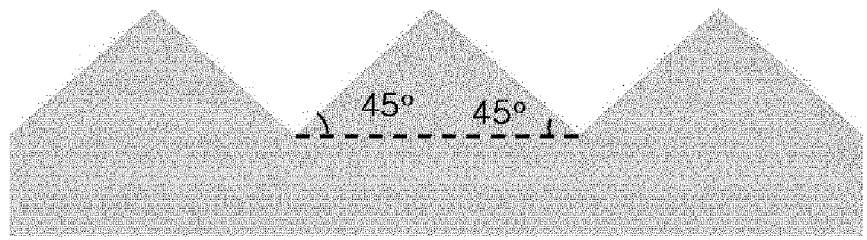
[FIG. 16]
|  | Angle(°) | | Thickness(nm) | | Color(CIE L*ab) | |
| --- | --- | --- | --- | --- | --- | --- |
|  | Left | Right | Left | Right | Left | Right |
| Example 4 | 70 | 20 | 5.7 | 3.7 | 54,7,4 | 90,0,10 |
| Example 5 | 70 | 20 | 19.0 | 12.2 | 57,11,62 | 53,7,4 |
| Comparative Example 2 | 45 | 45 | 6.3 | 6.3 | 52,7,4 | 52,7,4 |

[FIG. 17]
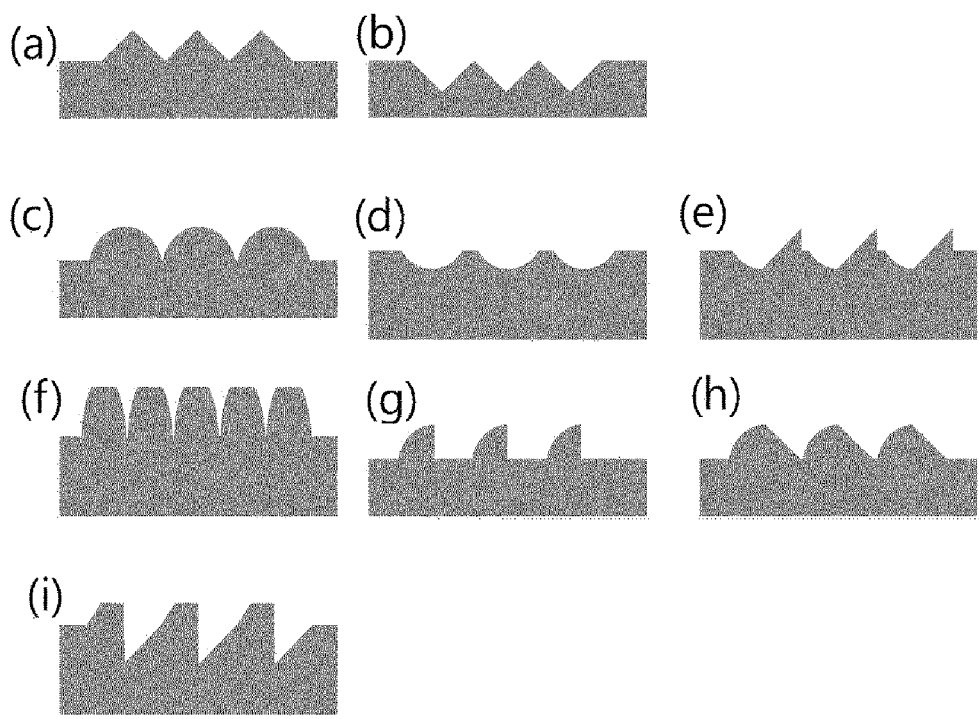

【FIG. 18】
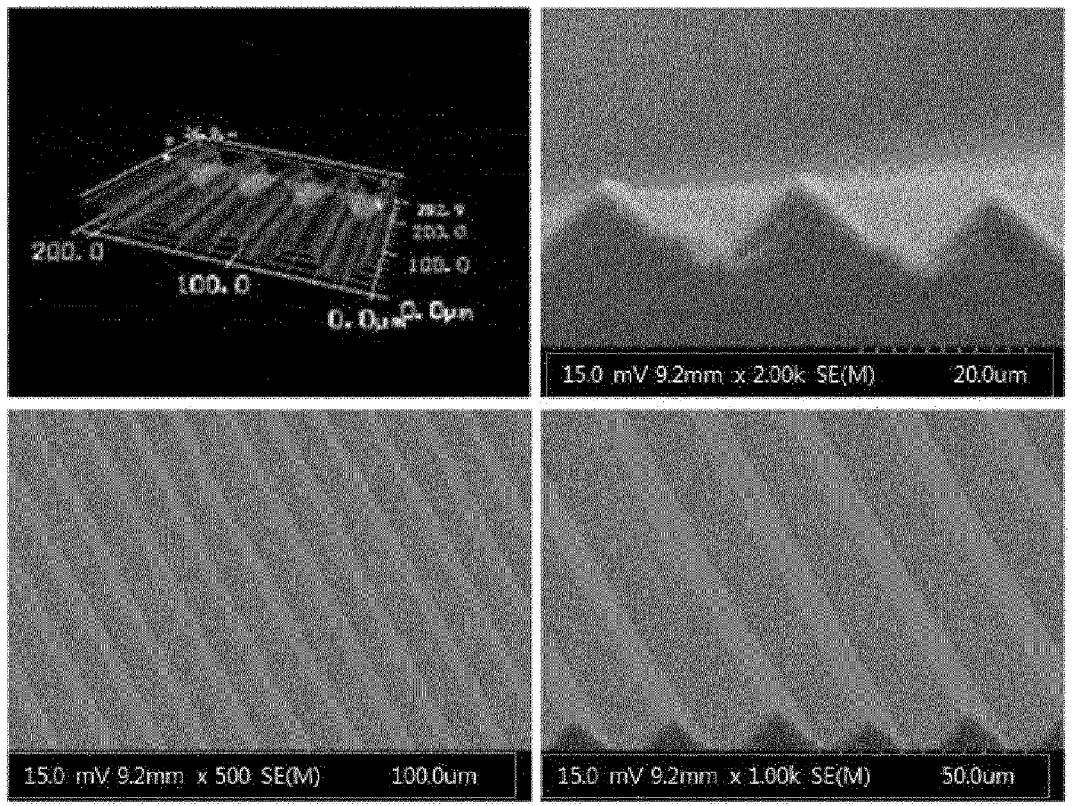
【FIG. 19】
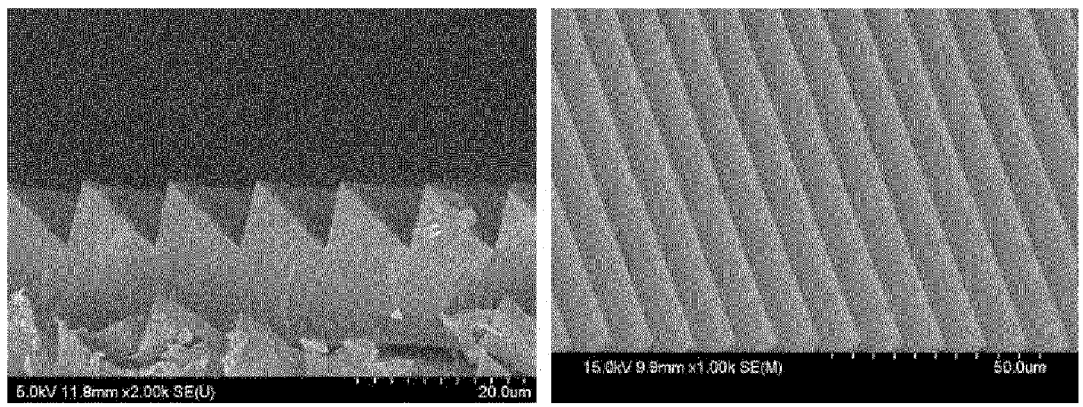

[FIG. 20]
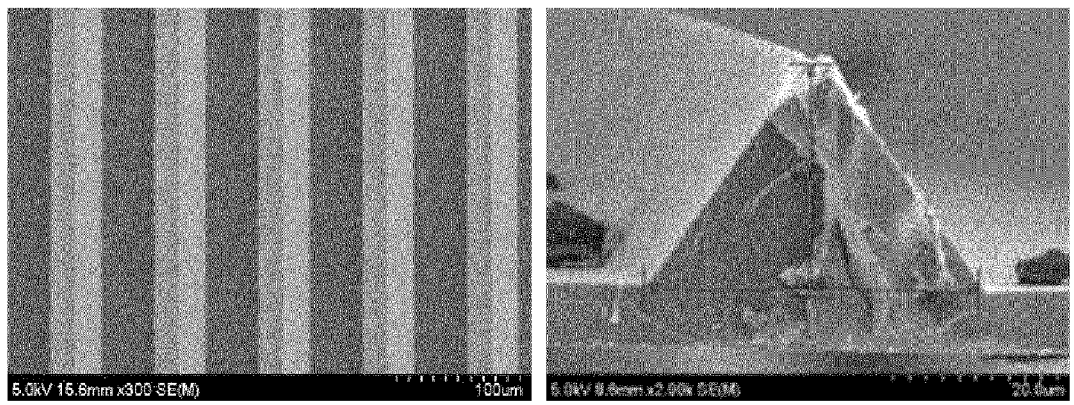
[FIG. 21]
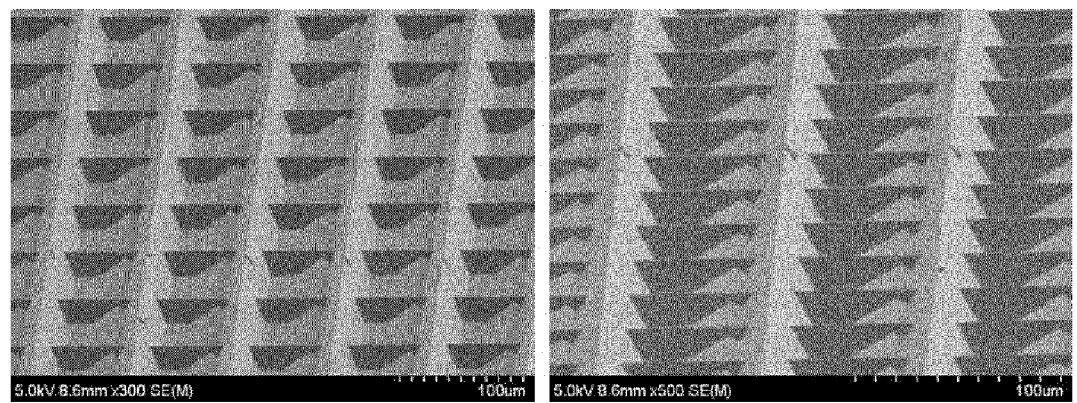

[FIG. 22]
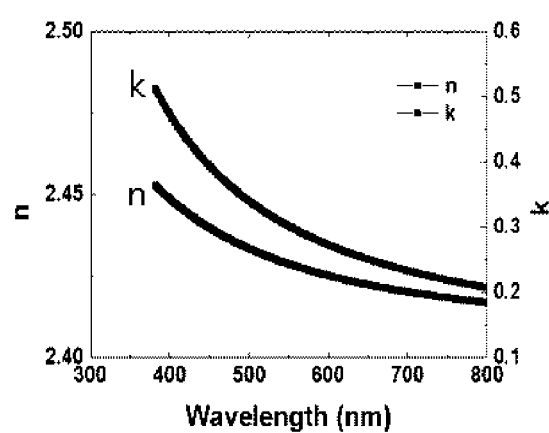

DECORATION MEMBER AND MANUFACTURING METHOD THEREFOR

This application is a National Stage Application of International Application No. PCT/KR2018/002672 filed on Mar. 6, 2018, which claims priority to and the benefits of Korean Patent Application No. 10-2017-0028261, filed with the Korean Intellectual Property Office on Mar. 6, 2017, and Korean Patent Application No. 10-2017-0136790, filed with the Korean Intellectual Property Office on Oct. 20, 2017, the entire contents of which are incorporated herein by reference.

TECHNICAL FIELD

The present disclosure relates to a decoration element and a method for preparing the same. In particular, the present disclosure relates to a decoration element suitable to be used in mobile devices or electronic products, and a method for preparing the same.

BACKGROUND ART

For mobile phones, various mobile devices and electronic products, product designs such as colors, shapes and patterns play a major role in providing values to customers in addition to product functions. Product preferences and prices are also dependent on designs.

As for mobile phones as one example, various colors and color senses are implemented using various methods and used in products. A method of providing colors to a mobile phone case material itself or a method of providing designs by attaching a deco film implementing colors and shapes to a case material may be included.

In existing deco films, attempts have been made to develop colors through methods such as printing and deposition. When expressing heterogeneous colors on a single surface, printing needs to be performed two or more times, and implementation is hardly realistic when applying various colors to a three-dimensional pattern. In addition, existing deco films have fixed colors depending on a viewing angle, and even when there is a slight change, the change is limited to just a difference in the color sense.

DISCLOSURE

Technical Problem

The present disclosure is directed to providing a decoration element capable of readily implementing a number of colors on the same surface, capable of implementing a number of colors on a three-dimensional pattern, and capable of providing color changes depending on a viewing angle.

Technical Solution

One embodiment of the present application provides a decoration element comprising a light reflective layer; and a color developing layer comprising a light absorbing layer provided on the light reflective layer, wherein the light absorbing layer comprises two or more points with different thicknesses.

According to another embodiment of the present application, the light absorbing layer comprises two or more regions with different thicknesses in the decoration element.

According to another embodiment of the present application, the light absorbing layer comprises one or more regions in which an upper surface has an inclined surface with an inclined angle of greater than 0 degrees and less than or equal to 90 degrees, and the light absorbing layer comprises one or more regions having a thickness different from a thickness in any one region having the inclined surface.

According to another embodiment of the present application, the light absorbing layer comprises one or more regions with a gradually changing thickness.

According to another embodiment of the present application, the light absorbing layer comprises one or more regions in which an upper surface has an inclined surface with an inclined angle of greater than 0 degrees and less than or equal to 90 degrees, and at least one region having the inclined surface has a structure in which a thickness of the light absorbing layer gradually changes.

According to another embodiment of the present application, the light reflective layer is a metal layer, a metal oxide, a metal nitride, a metal oxynitride layer, carbon or a carbon composite layer or an inorganic material layer.

According to another embodiment of the present application, the light absorbing layer has an extinction coefficient (k) value of greater than 0 and less than or equal to 4, and preferably 0.01 to 4 at 400 nm.

According to another embodiment of the present application, a substrate provided on a lower surface of the light reflective layer or an upper surface of the light absorbing layer is further included.

According to another embodiment of the present application, the decoration element is a deco film, a case of a mobile device, a case of an electronic product, or a commodity requiring color decoration.

Advantageous Effects

According to embodiments described in the present specification, light absorption occurs in each of an entering path when external light enters through a color developing layer and in a reflection path when reflected, and since external light is reflected on each of a light absorbing layer surface and a light reflective layer surface, a constructive interference and destructive interference phenomenon occurs between reflected light on the light absorbing layer surface and reflected light on the light reflective layer surface. Specific colors may be developed through such light absorption in an entering path and a reflection path, and a constructive interference and destructive interference phenomenon. In addition, developed colors are thickness dependent, and therefore, colors may vary depending on thicknesses even when having the same material composition.

Accordingly, a plurality of colors can be developed by allowing the light absorbing layer to have two or more points or regions with different thicknesses on the same surface, and by forming a color developing layer on a three-dimensional pattern, various colors can be implemented on the three-dimensional pattern.

In addition, when an upper surface of the light absorbing layer has at least one inclined surface, changes in the developed colors can be obtained depending on a viewing angle, and the light absorbing layer can be prepared to have two or more regions with different thicknesses using a simple process.

DESCRIPTION OF DRAWINGS

FIG. 1 is a mimetic diagram for describing a working principle of color development in a light reflective layer and light absorbing layer structure.

FIG. 2 to FIG. 5 illustrate a lamination structure of a decoration element according to embodiments of the present application.

FIG. 6 to FIG. 8 illustrate an upper surface structure of a light absorbing layer of a decoration element according to embodiments of the present application.

FIG. 9 to FIG. 11 are diagrams presenting color development being different depending on a thickness of a light absorbing layer.

FIG. 12 and FIG. 13 show results of observing structures and colors of decoration members prepared in Examples 1 to 3 and Comparative Example 1.

FIG. 14 and FIG. 15 illustrates a structure of a light absorbing layer of a decoration element prepared in each of Examples 4 and 5 and Comparative Example 2.

FIG. 16 shows colors observed in a direction perpendicular to an inclined surface of a decoration element prepared in each of Examples 4 and 5 and Comparative Example 2.

FIGS. 17 to 21 illustrate patterns capable of implementing on an upper surface of a light absorbing layer.

FIG. 22 is a graph presenting n and k values of an aluminum oxynitride.

Coordinate values of FIG. 13 and FIG. 16 indicate values on a Lab coordinate of each color.

MODE FOR DISCLOSURE

Hereinafter, the present disclosure will be described in detail.

In the present specification, a "point" means one position that does not have an area. In the present specification, the expression is used to indicate that a light absorbing layer has two or more points with different thicknesses.

In the present specification, a "region" represents a part having a certain area. For example, when placing the decoration element on the ground so that a light reflective layer is placed at the bottom and the light absorbing layer is placed at the top and dividing both ends of the inclined surface or both ends with the same thickness perpendicular with respect to the ground, the region having an inclined surface means an area divided by both ends of the inclined surface, and the region with the same thickness means an area divided by both ends with the same thickness.

In the present specification, a "surface" or "region" may be a flat surface, but is not limited thereto, and a part or all may be a curved surface. For example, structures in which a vertical cross-section shape is a part of an arc of a circle or oval, a wave structure, a zigzag or the like may be included.

In the present specification, an "inclined surface" means, when placing the decoration member on the ground so that a light reflective layer is placed at the bottom and the light absorbing layer is placed at the top, a surface having an angle formed by the upper surface with respect to the ground of greater than 0 degrees and less than or equal to 90 degrees.

In the present specification, a "thickness" of a certain layer means a shortest distance from a lower surface to an upper surface of the corresponding layer.

In the present specification, "or" represents, unless defined otherwise, a case of selectively or all comprising those listed, that is, a meaning of "and/or".

In the present specification, a "layer" means covering 70% or more of an area where the corresponding layer is present. It means covering preferably 75% or more, and more preferably 80% or more.

A decoration element according to one embodiment of the present application comprises a light reflective layer; and a color developing layer comprising a light absorbing layer provided on the light reflective layer, wherein the light absorbing layer comprises two or more points with different thicknesses.

According to another embodiment of the present application, the light absorbing layer comprises two or more regions with different thicknesses in the decoration element.

According to the embodiments, light absorption occurs in an entering path and a reflection path of light in the light absorbing layer, and by the light reflecting on each of a surface of the light absorbing layer and an interface of the light absorbing layer and the light reflective layer, the two reflected lights go through constructive or destructive interference. In the present specification, the light reflected on the surface of the light absorbing layer may be expressed as surface reflected light, and the light reflected on the interface of the light absorbing layer and the light reflective layer may be expressed as interface reflected light. A mimetic diagram of such a working principle is illustrated in FIG. 1. FIG. 1 illustrates a structure in which a substrate (101), a light reflective layer (201) and a light absorbing layer (301) are consecutively laminated, and although the substrate is located at the bottom of the light reflective layer, this structure is not essential.

Examples of the structure according to the embodiment are illustrated in FIG. 2 and FIG. 3. In FIG. 2 and FIG. 3, a light absorbing layer (301) is provided on a light reflective layer (201), and the light absorbing layer has two or more points with different thicknesses. According to FIG. 2, thicknesses at A point and B point are different in the light absorbing layer (301). According to FIG. 3, thicknesses in C region and D region are different in the light absorbing layer (301).

According to another embodiment of the present application, the light absorbing layer comprises one or more regions in which an upper surface has an inclined surface with an inclined angle of greater than 0 degrees and less than or equal to 90 degrees, and the light absorbing layer comprises one or more regions having a thickness different from a thickness in any one region having the inclined surface.

Surface properties such as an upper surface slope of the light reflective layer may be the same as an upper surface of the light absorbing layer. For example, by using a deposition method when forming the light absorbing layer, the upper surface of the light absorbing layer may have the same slope as the upper surface of the light reflective layer.

FIG. 4 illustrates a structure of a decoration element having a light absorbing layer in which an upper surface has an inclined surface. The structure is a structure laminating a substrate (101), a light reflective layer (201) and a light absorbing layer (301), and thickness t1 in E region and thickness t2 in F region are different in the light absorbing layer (301).

FIG. 4 relates to a light absorbing layer having inclined surfaces facing each other, that is, having a structure with a triangle cross-section. In the structure of the pattern having inclined surfaces facing each other as in FIG. 4, a thickness of the light absorbing layer may be different in two surfaces of the triangle structure even when progressing deposition under the same condition. Accordingly, a light absorbing layer having two or more regions with different thicknesses may be formed using just one process. As a result, developed colors may become different depending on the thickness of the light absorbing layer. Herein, the thickness of the light reflective layer does not affect changes in the color when it is a certain thickness or greater.

According to another embodiment of the present application, the light absorbing layer comprises one or more regions with a gradually changing thickness. FIG. 2 illustrates a structure in which a thickness of the light absorbing layer gradually changes.

According to another embodiment of the present application, the light absorbing layer comprises one or more regions in which an upper surface has an inclined surface with an inclined angle of greater than 0 degrees and less than or equal to 90 degrees, and at least one region having the inclined surface has a structure in which a thickness of the light absorbing layer gradually changes. FIG. 5 illustrates a structure of a light absorbing layer comprising a region in which an upper surface has an inclined surface. In FIG. 5, both G region and H region have a structure in which an upper surface of the light absorbing layer has an inclined surface, and a thickness of the light absorbing layer gradually changes.

According to one embodiment, the light absorbing layer comprises a first region having a first inclined surface with an inclined angle in a range of 1 degrees to 90 degrees, and may further comprise a second region in which an upper surface has an inclined surface with a different slope direction or a different inclined angle from the first inclined surface, or an upper surface is horizontal. Herein, thicknesses in the first region and the second region may be different from each other in the light absorbing layer.

According to another embodiment, the light absorbing layer comprises a first region having a first inclined surface with an inclined angle in a range of 1 degrees to 90 degrees, and may further comprise two or more regions in which an upper surface has an inclined surface with a different slope direction or a different inclined angle from the first inclined surface, or an upper surface is horizontal. Herein, thicknesses in the first region and the two or more regions may all be different from each other in the light absorbing layer.

According to another embodiment of the present application, the light absorbing layer comprises an asymmetric-structured pattern. In the present specification, an asymmetric-structured pattern means having an asymmetric structure on at least one surface when observing from the upper surface, a side surface or a cross-section. The decoration member may develop dichroism when having such an asymmetric structure. Dichroism means different colors being observed depending on a viewing angle.

Colors may be expressed by CIE L*a*b*, and a color difference may be defined using a distance (ΔE*ab) in the L*a*b* space. Specifically, the color difference is ΔE*ab=√{(ΔL)²+(Δa)²+(Δb)²}, and within a range of 0<ΔE*ab<1, an observer may not recognize the color difference [reference document: Machine Graphics and Vision 20(4):383-411]. Accordingly, dichroism may be defined by ΔE*ab>1 in the present specification.

According to one embodiment, the light absorbing layer comprises a pattern in which an upper surface has a cone-shaped protrusion or groove. The cone shape comprises a shape of a circular cone, an oval cone or a polypyramid. Herein, the shape of the bottom surface of the polypyramid comprises a triangle, a square, a star shape having 5 or more protruding points, and the like. The cone shape may have a shape of a protrusion formed on an upper surface of the light absorbing layer, or a shape of a groove formed on an upper surface of the light absorbing layer. The protrusion has a triangular cross-section, and the groove has an inverted triangular cross-section. A lower surface of the light absorbing layer may also have the same shape as the upper surface of the light absorbing layer.

According to one embodiment, the cone-shaped pattern may have an asymmetric structure. For example, when rotating the cone-shaped pattern 360 degrees based on the vertex of the cone and observing from the upper surface, dichroism is difficult to be developed from the pattern when three or more same shapes are present. However, when rotating the cone-shaped pattern 360 degrees based on the vertex of the cone and observing from the upper surface, dichroism may be developed when two or less same shapes are present. FIG. 6 illustrates an upper surface of the cone shape, and (a) all illustrates a symmetric-structured cone shape, and (b) illustrates an asymmetric-structured cone shape.

The symmetric-structured cone shape has a structure in which a cone-shaped bottom surface is a circle or a regular polygon having the same side lengths, and the vertex of the cone is present on a vertical line of the center of gravity of the bottom surface. However, the asymmetric-structured cone shape has a structure in which, when observing from the upper surface, the position of the vertex of the cone is present on a vertical line of a point that is not the center of gravity of the bottom surface, or has a structure in which the bottom surface is an asymmetric-structured polygon or oval. When the bottom surface is an asymmetric-structured polygon, at least one of the sides and the angles of the polygon may be designed to be different from the rest.

For example, as in FIG. 7, the position of the vertex of the cone may be changed. Specifically, when designing the vertex of the cone to be located on a vertical line of the center of gravity (01) of the bottom surface when observing from the upper surface as in the first drawing of FIG. 7, 4 identical structures may be obtained when rotating 360 degrees based on the vertex of the cone (4-fold symmetry). However, the symmetric structure is broken by designing the vertex of the cone on a position (02) that is not the center of gravity (01) of the bottom surface. When employing a length of one side of the bottom surface as x, migration distances of the vertex of the cone as a and b, a height of the cone shape, a length of a line vertically connecting from the vertex of the cone (01 or 02) to the bottom surface, as h, and an angle formed by the bottom surface and a side surface of the cone as θn, cosine values for Surface 1, Surface 2, Surface 3 and Surface 4 of FIG. 7 may be obtained as follows.

$$\cos(\theta 1) = \frac{\left(\frac{x}{2}\right)}{\text{sqrt}\left(h^2 + \left(\frac{x}{2}\right)^2\right)}$$

$$\cos(\theta 2) = \frac{\left(\frac{x}{2}\right)}{\text{sqrt}\left(h^2 + \left(\frac{x}{2}\right)^2\right)}$$

$$\cos(\theta 3) = \frac{\left(\frac{x}{2} - a\right)}{\text{sqrt}\left(h^2 + \left(\frac{x}{2} - a\right)^2\right)}$$

$$\cos(\theta 4) = \frac{\left(\frac{x}{2} - b\right)}{\text{sqrt}\left(h^2 + \left(\frac{x}{2} - b\right)^2\right)}$$

Herein, θ1 and θ2 are the same, and therefore, there is no dichroism. However, θ3 and θ4 are different, and |θ3−θ4| means a color difference between two colors (E*ab), and therefore, dichroism may be obtained. Herein, |θ3−θ4|>0. As above, how much the symmetric structure is broken, that is, a degree of asymmetry, may be represented quantitatively using an angle formed by the bottom surface and a side surface of the cone, and the value representing such a degree of asymmetry is proportional to a color difference of dichroism.

According to another embodiment, the light absorbing layer comprises a pattern having a protrusion in which the highest point has a line shape or a groove in which the lowest point has a line shape. FIG. 18 to FIG. 20 show images of examples having a line-shaped protrusion. The line shape may be a straight-line shape or a curved-line shape, and may comprise both a curved line and a straight line. When rotating the pattern having a line-shaped protrusion or groove 360 degrees based on the center of gravity of an upper surface and observing from the upper surface, dichroism is difficult to be developed when two or more same shapes are present. However, when rotating the pattern having a line-shaped protrusion or groove 360 degrees based on the center of gravity of an upper surface and observing from the upper surface, dichroism may be developed when only one same shape is present. FIG. 8 illustrates an upper surface of a pattern having a line-shaped protrusion, and (a) illustrates a pattern having a line-shaped protrusion developing no dichroism and (b) illustrates a pattern having a line-shaped protrusion developing dichroism. An X-X' cross-section of FIG. 8(a) is an isosceles triangle or an equilateral triangle, and a Y-Y' cross-section of FIG. 8(b) is a triangle having different side lengths.

According to another embodiment, the light absorbing layer comprises a pattern in which an upper surface has a protrusion or groove with a structure in which the cone-shaped upper surface is cut. FIG. 21 illustrates images of an inversed trapezoidal groove in which the cross-section is asymmetric. Such a cross-section of the pattern may have a trapezoidal or inversed trapezoidal shape. In this case, dichroism may also be developed by designing the upper surface, the side surface or the cross-section to have an asymmetric structure.

In addition to the structure illustrated above, various protrusion or groove patterns as in FIG. 17 may be obtained.

The light absorbing layer may implement various colors depending on a refractive index (n), an extinction coefficient (k) and a thickness (t). FIG. 9 shows reflectance by wavelength depending on a thickness of the light absorbing layer, and FIG. 10 shows colors obtained therefrom. Specifically, FIG. 9 is a reflectance simulation graph by CuO deposition thickness of CuO/Cu, and is a material prepared while varying a CuO thickness from 10 nm to 60 nm under the same deposition condition.

FIG. 11 shows a simulation result indicating that different colors are observed depending on a viewing angle. FIG. 11 is a simulation result of CuON/Al. In FIG. 11, the thickness of the light absorbing layer increases from 10 nm to 100 nm by 10 nm, and an incident angle is adjusted from 0 degrees to 60 degrees at a 15 degrees interval. Through such a simulation result, it is seen that, in the structure according to an embodiment of the present application, various colors may be obtained by adjusting a thickness of a light absorbing layer and an inclined angle of an upper surface.

The light reflective layer is not particularly limited as long as it is a material capable of reflecting light, however, light reflectance may be determined depending on the material, and for example, colors are readily expressed at 50% or greater. Light reflectance may be measured using an ellipsometer.

The light absorbing layer preferably has a refractive index (n) of 0 to 8 at 400 nm, and the refractive index may be from 0 to 7, may be from 0.01 to 3, and may be from 2 to 2.5. The refractive index (n) may be calculated by sin θ1/sin θ2 (θ1 is an angle of light incident on a surface of the light absorbing layer, and θ2 is a refraction angle of light inside the light absorbing layer).

The light absorbing layer preferably has a refractive index (n) of 0 to 8 at 380 nm to 780 nm, and the refractive index may be from 0 to 7, may be from 0.01 to 3, and may be from 2 to 2.5.

The light absorbing layer may have an extinction coefficient (k) of greater than 0 and less than or equal to 4 at 400 nm, and the extinction coefficient (k) is preferably from 0.01 to 4, may be from 0.01 to 3.5, may be from 0.01 to 3, and may be from 0.1 to 1. The extinction coefficient (k) is −(¼pI)(dI/dx) (herein, a value multiplying ¼p with dI/I, a reduced fraction of light intensity per a path unit length (dx), for example 1 m, in the light absorbing layer, and herein, l is a wavelength of light).

The light absorbing layer may have an extinction coefficient (k) of greater than 0 and less than or equal to 4 at 380 nm to 780 nm, and the extinction coefficient (k) is preferably from 0.01 to 4, may be from 0.01 to 3.5, may be from 0.01 to 3, and may be from 0.1 to 1. The extinction coefficient (k) is in the above-mentioned range at 400 nm, preferably in the whole visible wavelength region of 380 to 780 nm, and therefore, a role of a light absorbing layer may be performed in the visible range.

Even when having the same refractive index (n) value, a difference of $\Delta E^*ab=\sqrt{\{(\Delta L)^2+(\Delta a)^2+(\Delta b)^2\}}>1$ may be obtained when the extinction coefficient (k) value is 0 and when the extinction coefficient (k) value is 0.01 at 380 nm to 780 nm. For example, when simulating a case of irradiating D65 (solar spectrum) as a light source on a lamination structure of glass/aluminum/aluminum oxide/air layer, E*ab values when the k values of the aluminum oxide are 0 and 0.01 are obtained as in the following Table 1. Herein, the thickness (h1) of the aluminum layer is 120 nm, and the thickness (h2) of the aluminum oxide layer is described in the following Table 1. The k values are arbitrarily set at 0 and 0.01 for the simulation, and as the n value, the value of aluminum is used.

TABLE 1

| | k = 0 | | | k = 0.01 | | | |
|---|---|---|---|---|---|---|---|
| h2 [nm] | L | a | b | L | a | b | ΔE*ab |
| 40 | 86.63 | 1.75 | −1.25 | 85.18 | 2.09 | 0.03 | 1.96 |
| 60 | 89.83 | −4.02 | −8.30 | 87.86 | −4.06 | −9.01 | 2.10 |
| 80 | 95.60 | −1.87 | −2.58 | 94.44 | −2.05 | −2.86 | 1.20 |

For example, using a method of absorbing light by adding a dye to a resin, and using a material having an extinction coefficient as described above lead to different light absorption spectra. When absorbing light by adding a dye to a resin, an absorption wavelength band is fixed, and only a phenomenon of varying an absorption amount depending on the changes in the coating thickness occurs. In addition, in order to obtain a target light absorption amount, changes in the thickness of at least a few micrometers or more are required to adjust the light absorption amount. On the other hand, in materials having an extinction coefficient, a wavelength band absorbing light changes even when the thickness changes by a several to tens of nanometer scale.

According to one embodiment, the light reflective layer may be a metal layer, a metal oxynitride layer or an inorganic material layer. The light reflective layer may be formed in a single layer, or may be formed in a multilayer of two or more layers.

As one example, the light reflective layer may be a single layer or a multilayer comprising one or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof, and one or more types of materials among carbon and carbon composites. For example, the light reflective layer may comprise two or more alloys selected from among the above-mentioned materials, or oxides, nitrides or oxynitrides thereof. For example, the light reflective layer may comprise two or more alloys selected from among the above-mentioned metals. More specifically, the light reflective layer may comprise molybdenum, aluminum or copper. According to another embodiment, the light reflective layer may allow highly resistant reflective layer by being prepared using an ink comprising carbon or carbon composites. Carbon black, CNT and the like may be included as the carbon or carbon composites. The ink comprising carbon or carbon composites may comprise above-described materials, or oxides, nitrides or oxynitrides thereof, and for example, one or more types of oxides selected from among indium (In), titanium (Ti), tin (Sn), silicon (Si), germanium (Ge). aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag) may be included. A curing process may be further carried out after printing the ink comprising carbon or carbon composites.

When the light reflective layer comprises two or more types of materials, the two or more types of materials may be formed using one process, for example, a method of deposition or printing, however, a method of first forming a layer using one or more types of materials, and then additionally forming a layer thereon using one or more types of materials may be used. For example, a light reflective layer may be formed by forming a layer through depositing indium or tin, then printing an ink comprising carbon, and then curing the result. The ink may further comprise oxides such as titanium oxides or silicon oxides.

According to one embodiment, the light absorbing layer may be a single layer, or a multilayer of two or more layers. The light absorbing layer may be formed with materials having an extinction coefficient (k) at 380 nm to 780 nm, that is, materials having an extinction coefficient of greater than 0 and less than or equal to 4, and preferably 0.01 to 4. For example, the light absorbing layer may comprise one or more selected from the group consisting of metals, metalloids, and oxides, nitrides, oxynitrides and carbides of metals or metalloids. The oxides, nitrides, oxynitrides or carbides of metals or metalloids may be formed under a deposition condition and the like set by those skilled in the art. The light absorbing layer may also comprise the same metals, metalloids, alloys or oxynitrides of two or more types as the light reflective layer.

For example, the light absorbing layer may be a single layer or a multilayer comprising one or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof. As specific examples, the light absorbing layer comprises one or more types selected from among copper oxides, copper nitrides, copper oxynitrides, aluminum oxides, aluminum nitrides, aluminum oxynitrides and molybdenum titanium oxynitrides.

According to one embodiment, the light absorbing layer comprises silicon (Si) or germanium (Ge).

The light absorbing layer formed with silicon (Si) or germanium (Ge) may have a refractive index (n) of 0 to 8, or 0 to 7 at 400 nm, and may have an extinction coefficient (k) of greater than 0 and less than or equal to 4, preferably 0.01 to 4, and the extinction coefficient (k) may be from 0.01 to 3 or from 0.01 to 1.

According to another embodiment, the light absorbing layer comprises one or more types selected from among copper oxides, copper nitrides, copper oxynitrides, aluminum oxides, aluminum nitrides, aluminum oxynitrides and molybdenum titanium oxynitrides. In this case, the light absorbing layer may have a refractive index (n) of 1 to 3, for example, 2 to 2.5 at 400 nm, and an extinction coefficient (k) of greater than 0 and less than or equal to 4, preferably 0.01 to 2.5, preferably 0.2 to 2.5 and more preferably 0.2 to 0.6.

According to one embodiment, the light absorbing layer is AlOxNy (x>0, y>0).

According to another embodiment, the light absorbing layer may be AlOxNy (0≤x≤1.5, 0≤y≤1).

According to another embodiment, the light absorbing layer is AlOxNy (x>0, y>0), and with respect to the total number of atoms 100%, the number of each atom satisfies the following equation.

$$1 < \frac{(Al)at \times 3}{(O)at \times 2 + (N)at \times 3} < 2$$

According to one embodiment, the light absorbing layer may be formed with materials having an extinction coefficient (k) at 400 nm, preferably at 380 to 780 nm, and for example, the light absorbing layer/light reflective layer may be formed with materials such as CuO/Cu, CuON/Cu, CuON/Al, AlON/Al, AlN/AL/AlON/Cu or AlN/Cu.

According to one embodiment, the thickness of the light reflective layer may be determined depending on target color in a final structure, and for example, may be 1 nm or greater, preferably 25 nm or greater, for example, 50 nm or greater, and preferably 70 nm or greater.

According to one embodiment, the thickness of the light absorbing layer may be from 5 nm to 500 nm, for example, from 30 nm to 500 nm.

According to one embodiment, a difference in the thickness by the region of the light absorbing layer is from 2 nm to 200 nm, and may be determined depending on a target color difference.

According to one embodiment, a substrate provided on a lower surface of the light reflective layer or an upper surface of the light absorbing layer may be further included. Surface properties such as an upper surface slope of the substrate may be the same as upper surfaces of the light reflective layer and the light absorbing layer. By forming the light reflective layer and the light absorbing layer using a deposition method, the substrate, the light reflective layer and the light absorbing layer may have an inclined surface with the same angle. For example, the structure as above may be obtained by forming an inclined surface or a three-dimensional structure on an upper surface of a substrate, and depositing a light reflective layer and a light absorbing layer thereon in this order, or depositing a light absorbing layer and a light reflective layer in this order.

According to one embodiment, forming an inclined surface or a three-dimensional structure on the substrate surface may be carried out using a method of forming a pattern on an ultraviolet curable resin and curing the result using ultraviolet rays, or processing with laser. According to one embodiment, the decoration element may be a deco film or a case of a mobile device. The decoration element may further comprise a gluing layer as necessary.

Materials of the substrate are not particularly limited, and ultraviolet curable resins known in the art may be used when forming an inclined surface or a three-dimensional structure using methods as above.

On the light absorbing layer, a protective layer may be further provided.

According to one embodiment, an adhesive layer may be further provided on an opposite surface of the substrate provided with the light absorbing layer or the light reflective layer. This adhesive layer may be an optically clear adhesive (OCA) layer. As necessary, a peel-off layer (release liner) may be further provided on the adhesive layer for protection.

Deposition such as a sputtering method has been described as an example of forming the light reflective layer and the light absorbing layer in the present specification, however, various methods of preparing a thin film may be used as long as constitutions and properties according to embodiments described in the present specification are obtained. For example, a vapor deposition method, a chemical vapor deposition (CVD) method, wet coating and the like may be used.

Hereinafter, the present disclosure will be described in more detail with reference to examples. However, the following examples are for illustrative purposes only, and are not to limit the scope of the present disclosure.

Examples 1 to 3

After forming a pattern (FIG. 12) by coating an ultraviolet curable resin on a PET substrate, an $AlO_xN_y$ (0≤x, 0.1≤y≤1) light absorbing layer was formed on the pattern of the substrate using a reactive sputtering method by adding nitrogen. On the light absorbing layer, Al having a thickness of 100 nm was deposited using a sputtering method to form a light reflective layer (Al, thickness 120 nm).

The pattern shape was formed in a structure repeating a asymmetric prism structure as in FIG. 12, and an inclined angle on one side surface of the pattern was 60°, and an inclined angle on the other side was employed to be 40° (Example 1), 30° (Example 2) and 20° (Example 3) when preparing a sample. Herein, a pitch of the patterns was 100 micrometers, and a height of the pattern was 25 micrometers. Light entered to the substrate side of the obtained sample, passed through the light absorbing layer, and light reflected on the light reflective layer may be observed from the substrate side. The thickness and the color of the light absorbing layer observed from the obtained sample are shown in FIG. 13. n and k values of the aluminum oxynitride layer are described in FIG. 22.

Comparative Example 1

A sample was prepared in the same manner as in Examples 1 to 3 except that both sides of the inclined surface of the pattern were employed to be 60° as in FIG. 12, and the light absorbing layer was formed to have the same thickness.

Colors of Examples 1 to 3 and Comparative Example 1 are shown in FIG. 13. In Example 1, colors on the left and the right were similar as yellow series, however, changes to a red tone was identified on the left side. In Example 2, the colors changed to a purple tone as the left side angle decreased. In Example 3, a darker purple compared to Example 2 was obtained. On the other hand, it was identified that the same yellow series color was obtained on both the left and the right in Comparative Example 1.

Example 4

An experiment was carried out in the same manner as in Examples 1 to 3 except that, by forming the pattern shape as in FIG. 14, the deposition thickness of the light absorbing layer on the left side inclined surface was employed to be 5.7 nm, and the deposition thickness of the light absorbing layer on the right side inclined surface was employed to be 3.7 nm, based on the vertex of the triangle of the cross-section of the light absorbing layer. An image of the color in a vertical direction on the inclined surface of the obtained sample is shown in FIG. 16.

Example 5

An experiment was carried out in the same manner as in Example 4 except that the deposition thickness of the light absorbing layer on the left side inclined surface was employed to be 19.0 nm, and the deposition thickness of the light absorbing layer on the right side inclined surface was employed to be 12.2 nm, based on the vertex of the triangle of the cross-section of the light absorbing layer. An image of the color in a vertical direction on the inclined surface of the obtained sample is shown in FIG. 16.

Comparative Example 2

An experiment was carried out in the same manner as in Example 4 except that the pattern shape was formed to have a both surface symmetrical inclined surface as in FIG. 15, and the deposition thickness of the light absorbing layer on the inclined surface of the light absorbing layer was uniform as 6.3 nm. An image of the color in a vertical direction on the inclined surface of the obtained sample is shown in FIG. 16.

The invention claimed is:

1. A decoration element comprising:
   a light reflective layer; and
   a color developing layer comprising a light absorbing layer provided on the light reflective layer,
   wherein the light absorbing layer comprises two or more points with different thicknesses, and
   wherein the light absorbing layer is a single layer or a multilayer comprising one or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof.

2. The decoration element of claim 1, wherein the light absorbing layer comprises two or more regions with different thicknesses.

3. The decoration element of claim 1, wherein the light absorbing layer comprises one or more regions in which an upper surface has an inclined surface with an inclined angle of greater than 0 degrees and less than or equal to 90 degrees, and the light absorbing layer comprises one or more regions having a thickness different from a thickness in any one region having the inclined surface.

4. The decoration element of claim 1, wherein the light absorbing layer comprises one or more regions with a gradually changing thickness.

5. The decoration element of claim 1, wherein the light absorbing layer comprises one or more regions in which an upper surface has an inclined surface with an inclined angle of greater than 0 degrees and less than or equal to 90 degrees, and at least one region having the inclined surface has a structure in which a thickness of the light absorbing layer gradually changes.

6. The decoration element of claim 1, wherein the light absorbing layer has dichroism of ΔE*ab>1.

7. The decoration element of claim 1, wherein an upper surface of the light absorbing layer comprises a pattern having a cone-shaped protrusion or groove, a pattern having a protrusion in which the highest point has a line shape or a groove in which the lowest point has a line shape, or a pattern having a protrusion or groove with a structure in which the cone-shaped upper surface is cut.

8. The decoration element of claim 7, wherein, in the pattern having a cone-shaped protrusion or groove, two or less same shapes are present when rotating the cone-shaped pattern 360 degrees based on the vertex of the cone and observing from the upper surface.

9. The decoration element of claim 7, wherein, in the pattern having a protrusion in which the highest point has a line shape or a groove in which the lowest point has a line shape, only one same shape is present when rotating 360 degrees based on the center of gravity of the upper surface and observing from the upper surface.

10. The decoration element of claim 1, wherein the light absorbing layer has a refractive index of 0 to 8 at 400 nm.

11. The decoration element of claim 1, wherein the light absorbing layer has an extinction coefficient of greater than 0 and less than or equal to 4 at 400 nm.

12. The decoration element of claim 1, wherein the light reflective layer is a single layer or a multilayer comprising one or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof, and one or more types of materials among carbon and carbon composites.

13. The decoration element of claim 1, wherein the light reflective layer has a thickness of 1 nm or greater.

14. The decoration element of claim 1, wherein the light absorbing layer has a thickness of 5 nm to 500 nm.

15. The decoration element of claim 1, wherein a difference in the thickness by the region of the light absorbing layer is from 2 nm to 200 nm.

16. The decoration element of claim 1, further comprising a substrate provided on a lower surface of the light reflective layer.

17. The decoration element of claim 1, which is a deco film or a case of a mobile device.

* * * * *